United States Patent
Sai

(10) Patent No.: US 9,711,499 B2
(45) Date of Patent: Jul. 18, 2017

(54) SEMICONDUCTOR DEVICE

(71) Applicant: KABUSHIKI KAISHA TOSHIBA, Tokyo (JP)

(72) Inventor: Hideaki Sai, Ibo Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 64 days.

(21) Appl. No.: 14/637,283

(22) Filed: Mar. 3, 2015

(65) Prior Publication Data

US 2016/0093605 A1 Mar. 31, 2016

(30) Foreign Application Priority Data

Sep. 26, 2014 (JP) ................................. 2014-196403

(51) Int. Cl.
*H01L 21/00* (2006.01)
*H01L 29/861* (2006.01)
(Continued)

(52) U.S. Cl.
CPC ...... *H01L 27/0255* (2013.01); *H01L 27/0814* (2013.01); *H01L 29/0684* (2013.01);
(Continued)

(58) Field of Classification Search
CPC .......................... H01L 27/0255; H01L 29/0684
(Continued)

(56) References Cited

U.S. PATENT DOCUMENTS 7,579,632 B2 * 8/2009 Salih ....................... H01L 23/60
257/173

7,888,232 B2 * 2/2011 Schmenn ............ H01L 27/0255
257/168
(Continued)

FOREIGN PATENT DOCUMENTS

| JP | 2012-146717 A | 8/2012 |
| JP | 2012182381 A | 9/2012 |
| JP | 5162186 B2 | 3/2013 |

OTHER PUBLICATIONS

Taiwanese Office Action dated Jun. 7, 2016 in related Taiwanese Patent Application 104107094 (with English Translation).

*Primary Examiner* — Calvin Lee
(74) *Attorney, Agent, or Firm* — Patterson & Sheridan, LLP

(57) ABSTRACT

A semiconductor device includes first and second semiconductor regions, and a third semiconductor region between the first and second semiconductor regions, wherein the dopant concentration of the third semiconductor region is greater than the dopant concentration of the second semiconductor region. The semiconductor device further includes a fourth semiconductor region selectively provided on an upper surface of the second semiconductor region, wherein a portion of the second semiconductor region is interposed between the third semiconductor region and the fourth semiconductor region, an insulating layer disposed on the second semiconductor region and the fourth semiconductor region and having an opening that exposes a portion of a top surface of the fourth semiconductor region, wherein the ratio of an area of opening to an area of the top surface is from 10% to 90%, and a wiring layer on the insulating layer and connected to the fourth semiconductor region via the opening.

10 Claims, 11 Drawing Sheets

(51) Int. Cl.
*H01L 27/02* (2006.01)
*H01L 29/06* (2006.01)
*H01L 27/08* (2006.01)
*H01L 29/36* (2006.01)
*H01L 29/16* (2006.01)
*H01L 29/20* (2006.01)

(52) U.S. Cl.
CPC ............ *H01L 29/36* (2013.01); *H01L 29/861* (2013.01); *H01L 29/1608* (2013.01); *H01L 29/2003* (2013.01)

(58) Field of Classification Search
USPC ........... 438/91, 380; 257/603, 551, 355, 173
See application file for complete search history.

(56) References Cited

U.S. PATENT DOCUMENTS

| | | | |
|---|---|---|---|
| 8,338,854 B2 * | 12/2012 | Bobde | H01L 27/0259 257/112 |
| 8,431,958 B2 * | 4/2013 | Bobde | H01L 27/0255 257/173 |
| 2011/0073949 A1 | 3/2011 | Sai | |
| 2014/0070367 A1 | 3/2014 | Kawase et al. | |

* cited by examiner

SEMICONDUCTOR DEVICE

CROSS-REFERENCE TO RELATED APPLICATION

This application is based upon and claims the benefit of priority from Japanese Patent Application No. 2014-196403, filed Sep. 26, 2014, the entire contents of which are incorporated herein by reference.

FIELD

Embodiments described herein relate generally to a semiconductor device.

BACKGROUND

In general, a PN diode is used as an element configuring an ESD protection circuit in a semiconductor device which includes the ESD protection circuit. In addition, breakdown of the PN diode is used as a method of ESD protection in some cases.

Here, the PN diode which configures the ESD protection circuit is generally element-separated in the semiconductor device, i.e., it is isolated from the device it is protecting. As a method of element-separating the PN diode in the semiconductor device, there is a method of element-separating the PN diode using a dopant diffused layer. However, to form the dopant diffused layer, an extended time period of heat treatment must be performed. Therefore, the dopant is thermally diffused in the semiconductor layer, such that a distribution of a dopant concentration in a PN junction becomes moderate in some cases.

When the distribution of the dopant concentration in the PN junction becomes moderate, a breakdown voltage of the PN diode is unlikely to be lowered. Therefore, a clamp voltage of a protection circuit provided downstream of the ESD protection circuit is unlikely to be lowered.

DETAILED DESCRIPTION

Figure 1A:
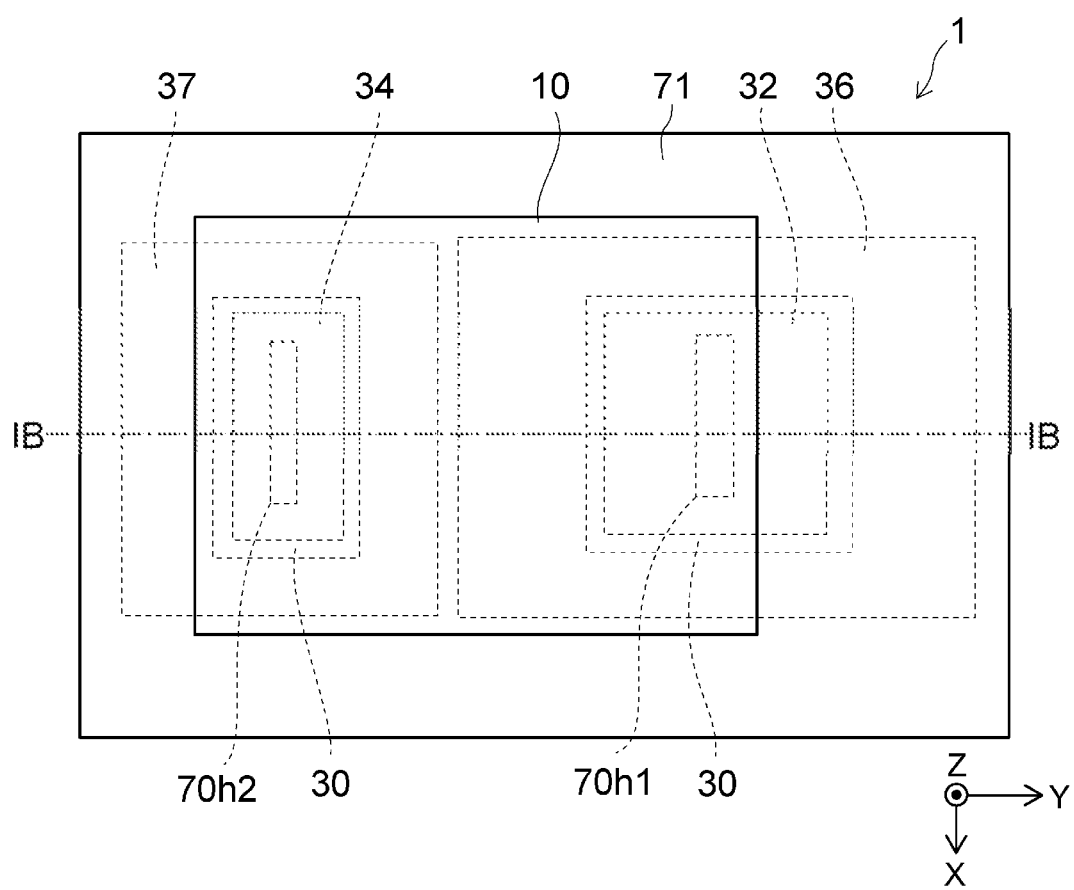
FIG. 1A is a schematic view which illustrates a main part of a semiconductor device according to an embodiment taken along line IA-IA of FIG. 1B.

Exemplary embodiments provide a semiconductor device which enables ESD protection by lowering a breakdown voltage.

In general, according to one embodiment, a semiconductor device includes a first semiconductor region of a first conductivity type, a second semiconductor region of a second conductivity type that is provided on the first semiconductor region, a third semiconductor region of a second conductivity type that is provided between the first semiconductor region and the second semiconductor region, and in which a bottom thereof is in contact with the first semiconductor region, a portion of a top on a side opposite to the bottom is in contact with the second semiconductor region, and a dopant concentration thereof is higher than an dopant concentration of the second semiconductor region. The device further includes a fourth semiconductor region of a first conductivity type that is selectively provided on a surface of the second semiconductor region on a side opposite to the first semiconductor region, and includes a portion of the second semiconductor region interposed between the third semiconductor region and the fourth semiconductor region, an insulating layer that is provided on the second semiconductor region and the fourth semiconductor region and having a first opening that exposes a portion of a top surface of the fourth semiconductor region, wherein a ratio of an area of the portion to an area of the top surface is from 10% to 90%, and a wiring layer that is provided on the insulating layer and connected to the fourth semiconductor region via the first opening.

Hereinafter, each embodiment will be described with reference to the drawings. In addition, in the following description, the same reference numerals are applied to the same members, and a description of members which are described once will be appropriately omitted.

Figure 1B:
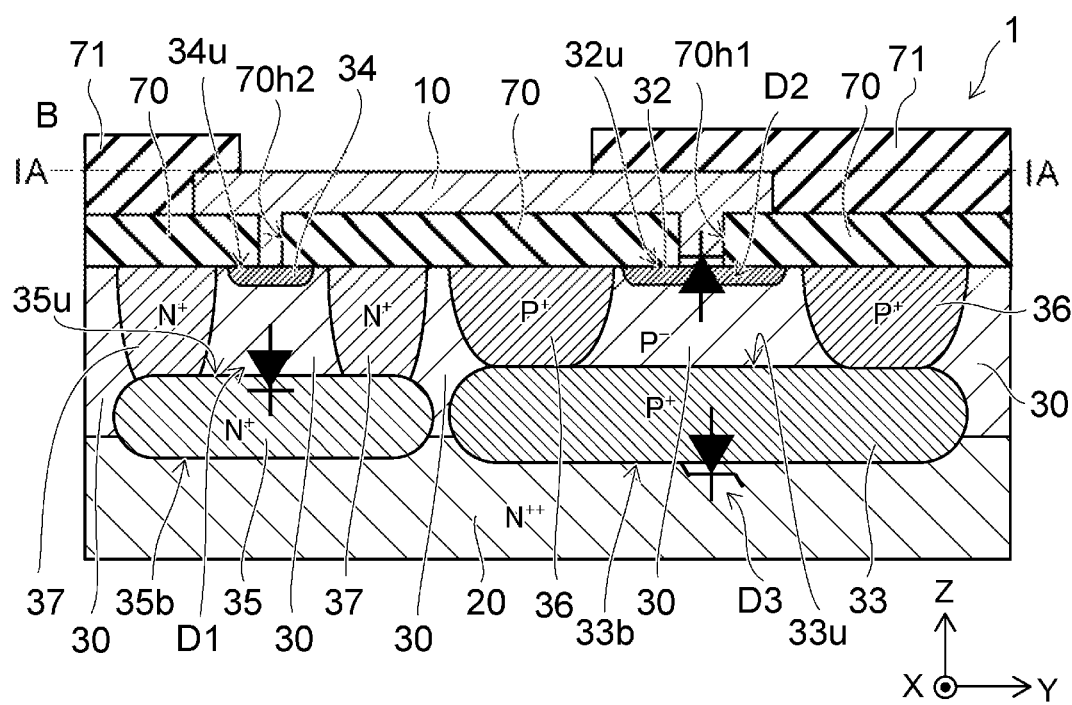
FIG. 1B is a schematic cross-sectional view which illustrates the main part of the semiconductor device according to the embodiment taken along line IB-IB of FIG. 1A.

FIG. 1A is a schematic view which illustrates a main part of a semiconductor device according to an embodiment taken along line IA-IA of FIG. 1B. FIG. 1B is a schematic cross-sectional view which illustrates the main part of the semiconductor device according to the embodiment, and is a view which illustrates a section taken along line IB-IB of FIG. 1A.

In a semiconductor device 1 according to the embodiment, a plurality of ESD protection diodes (hereinafter, for example, PN diodes D1, D2, and a zener diode D3, all shown in FIG. 1B) are provided. A circuit is provided in the semiconductor device 1 by combining the PN diode D1 in parallel with the series connection of diode D2, and the zener diode D3.

The semiconductor device 1 includes a first semiconductor region (hereinafter, for example, a semiconductor region 20), a second semiconductor region (hereinafter, for example, a semiconductor region 30), a third semiconductor region (hereinafter, for example, a semiconductor region 33), a fourth semiconductor region (hereinafter, for example, a semiconductor region 32), a fifth semiconductor region (hereinafter, for example, a semiconductor region 35), a sixth semiconductor region (hereinafter, for example, a semiconductor region 34), a seventh semiconductor region (hereinafter, for example, a semiconductor region 36), an eighth semiconductor region (hereinafter, for example, a semiconductor region 37), a wiring layer 10, an insulating layer 70, and a protection film 71.

The semiconductor region 20 is a semiconductor substrate of the semiconductor device 1. A conductivity type of the semiconductor region 20 is an $N^{++}$-type. The semiconductor region 20 contains arsenic (As) or antimony (Sb) as dopants thereof. Furthermore, the semiconductor region 20 may be doped with phosphorus (p).

The semiconductor region 30 is provided on the semiconductor region 20. A conductivity type of the semiconductor region 30 is a $P^-$-type. The semiconductor region 30 is in contact with the semiconductor region 20. The semiconductor region 30 is, for example, an epitaxially grown layer formed on the semiconductor region 20.

The semiconductor region 33 is selectively provided between the semiconductor region 20 and the semiconductor region 30, such that to either side thereof, semiconductor regions 20 and 30 may be in contact with one another. For example, a bottom 33b of the semiconductor region 33 is in contact with the semiconductor region 20, and a portion of a top 33u of a side opposite to the bottom 33b is in contact with the semiconductor region 30. A conductivity type of the semiconductor region 33 is a $P^+$-type. The semiconductor region 33 is in contact with the semiconductor region 20 and the semiconductor region 30. A dopant concentration of the semiconductor region 33 is higher than a dopant concentration of the semiconductor region 30. The zener diode D3 is configured of the semiconductor region 33 and the semiconductor region 20.

The semiconductor region 32 is selectively provided on a surface of the semiconductor region 30 on the side thereof opposite to the interface region of semiconductor region 30 and semiconductor region 20. A conductivity type of the semiconductor region 32 is an $N^+$-type. A portion of the semiconductor region 30 extending over the upper surface 33u of the semiconductor region 33 extends between the semiconductor region 32 and the semiconductor region 33. The semiconductor region 32 is in contact with the semiconductor region 30. The PN diode D2 is configured of the semiconductor region 32 and the semiconductor region 30.

The semiconductor region 35 is selectively provided between the semiconductor region 20 and the semiconductor region 30. For example, a bottom 35b of the semiconductor region 35 is in contact with the semiconductor region 20, and a portion of a top 35u of the semiconductor region 35 on a side opposite to the bottom 35b thereof is in contact with the semiconductor region 30. A conductivity type of the semiconductor region 35 is an $N^+$-type. The semiconductor region 35 is selectively provided between the semiconductor region 20 and the semiconductor region 30 where the semiconductor region 33 is not provided, and is spaced therefrom by an interface region between the semiconductor region 20 and the semiconductor region 30. The semiconductor region 35 is in contact with the semiconductor region 20 and the semiconductor region 30. The dopant concentration of the semiconductor region 35 is lower than the dopant concentration of the semiconductor region 20. The PN diode D1 is configured with the semiconductor region 35 and the semiconductor region 30.

The semiconductor region 34 is selectively provided on a surface of the semiconductor region 30 on a side thereof opposite to the side of the semiconductor region 30 in contact with semiconductor region 20 between semiconductor regions 33, 35. The conductivity type of the semiconductor region 34 is a $P^+$-type. The semiconductor region 34 is selectively provided on the surface of the semiconductor region 30 at a location thereof where the semiconductor region 32 is not provided. A portion of the semiconductor region 30 on the semiconductor region 35 extends between the semiconductor region 34 and the semiconductor region 35.

The semiconductor region 36 is provided on the semiconductor region 33. The semiconductor region 36 is in contact with the semiconductor region 30 located on the semiconductor region 33. The semiconductor region 36 surrounds the portion of the semiconductor region 30 located on the semiconductor region 33 (FIG. 1A). The conductivity type of the semiconductor region 36 is a $P^+$-type. The semiconductor region 36 is connected to, and contacts, the semiconductor region 33. The semiconductor region 36 forms or creates an element separation region in which the PN diode D2 and the zener diode D3 are separated from the semiconductor region 30.

The semiconductor region 37 is provided on the semiconductor region 35. The semiconductor region 37 is in contact with the semiconductor region 30 on the semiconductor region 35. The semiconductor region 37 surrounds the portion of the semiconductor region 30 located on the semiconductor region 35 (FIG. 1A). The conductivity type of the semiconductor region 37 is an $N^+$-type. The semiconductor region 37 is connected to the semiconductor region 35. The semiconductor region 37 forms or creates an element separation region in which the PN diode D1 is separated from the semiconductor region 30.

The semiconductor 33, the semiconductor region 32, the semiconductor region 35, the semiconductor region 34, the semiconductor region 36, and the semiconductor region 37 are dopant diffusion regions which are formed by an injection of dopant elements into the semiconductor region 20 or the semiconductor region 30 and a heating.

The insulating layer 70 is provided on each of the semiconductor region 30, the semiconductor region 32, the semiconductor region 34, the semiconductor region 36, and the semiconductor region 37. A first opening (hereinafter, for example, an opening 70h1) extends through insulating layer to expose a portion the top surface 32u of the semiconductor region 32 and a second opening (hereinafter, for example, an opening 70*h*2) extends through insulating layer 70 to expose a portion of a top surface 34*u* of the semiconductor region 34, are provided in the insulating layer 70.

A wiring layer 10 is provided on the insulating layer 70 and extends inwardly of openings 70*h*1 and 70*h*2. The wiring layer 10 is connected to the semiconductor region 32 via the opening 70*h*1. In addition, the wiring layer 10 is connected to the semiconductor region 34 via the opening 70*h*2.

The wiring layer 10 is in ohmic contact with the semiconductor region 32 and the semiconductor region 34. The protection film 71 is provided on each of the insulating layer 70 and the wiring layer 10.

A main component of each semiconductor region is, for example, silicon (Si). In addition, the main component of each semiconductor region may be a silicon carbide (SiC), a nitride gallium (GaN). Moreover, in the embodiment, unless otherwise noted, an N-type (first conductivity type) dopant concentration is lowered in an order of $N^{++}$-type to $N^+$-type. In addition, in the embodiment a P-type (second conductivity type) dopant concentration is lowered in an order of $p^+$-type to p-type.

As an N-type dopant element, for example, arsenic (As), antimony (Sb), phosphorus (p), or the like is applied. As a P-type dopant element, for example, boron (B) or the like is applied.

A material of the wiring layer 10 is a metal which includes at least one of the group of aluminum (Al), titanium (Ti), nickel (Ni), tungsten (W), gold (Au), and the like. In addition, a material of the insulating layer 70 includes, for example, a silicon oxide, a silicon nitride, and the like.

Figure 2:
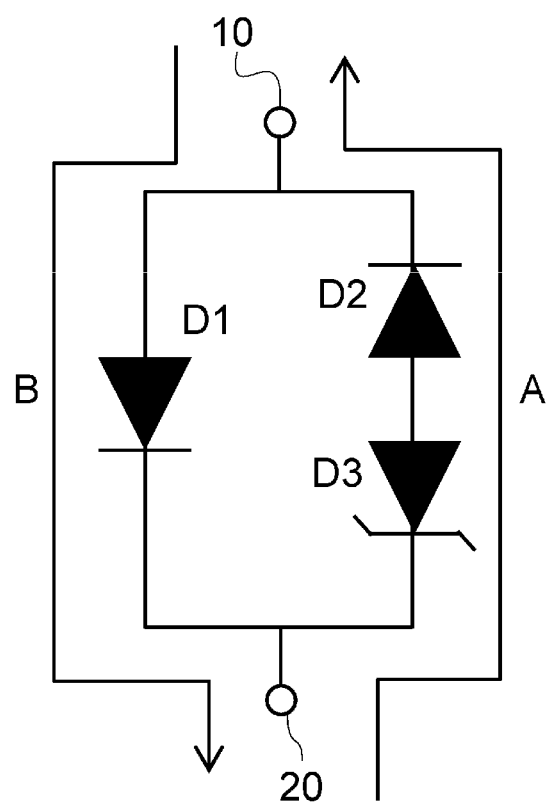
FIG. 2 is an equivalent circuit diagram of a circuit incorporated in the semiconductor device according to the embodiment.

FIG. 2 is an equivalent circuit diagram illustrating a circuit incorporated in the semiconductor device according to the embodiment.

In the semiconductor device 1, a crowbar circuit is configured as an example. For example, a set of diodes including, for example, a series connection of the PN diode D2 and the zener diode D3 are connected in parallel with the PN diode D1. A potential of the semiconductor region 20 is set to be a ground potential.

For example, when a negative transient voltage is applied to the wiring layer 10, the PN diode D2 is biased in a forward direction, the zener diode D3 is biased in a reverse direction, and the PN diode D1 is biased in the reverse direction, respectively.

The breakdown voltage of the zener diode D3 may be arbitrarily set. Accordingly, the breakdown voltage of the zener diode D3 is set to be lower than the breakdown voltage of the PN diode D1, whereby a current does not flow in the reverse direction in the PN diode D1, but flows in the reverse direction in the zener diode D3. Accordingly, a transient current (surge current) flows (arrow A) from the semiconductor region 20 to the wiring layer 10 through the zener diode D3 and the PN diode D2.

On the other hand, when a positive transient voltage is applied to the wiring layer 10, the PN diode D2 is biased in the reverse direction, the zener diode D3 is biased in the forward direction, and the PN diode D1 is biased in the forward direction, respectively. When a forward direction voltage of the PN diode D1 is set to be lower than a breakdown voltage of the PN diode D2, a transient current flows (arrow B) from the wiring layer 10 to the semiconductor region 20 through the PN diode D1.

Figure 3:
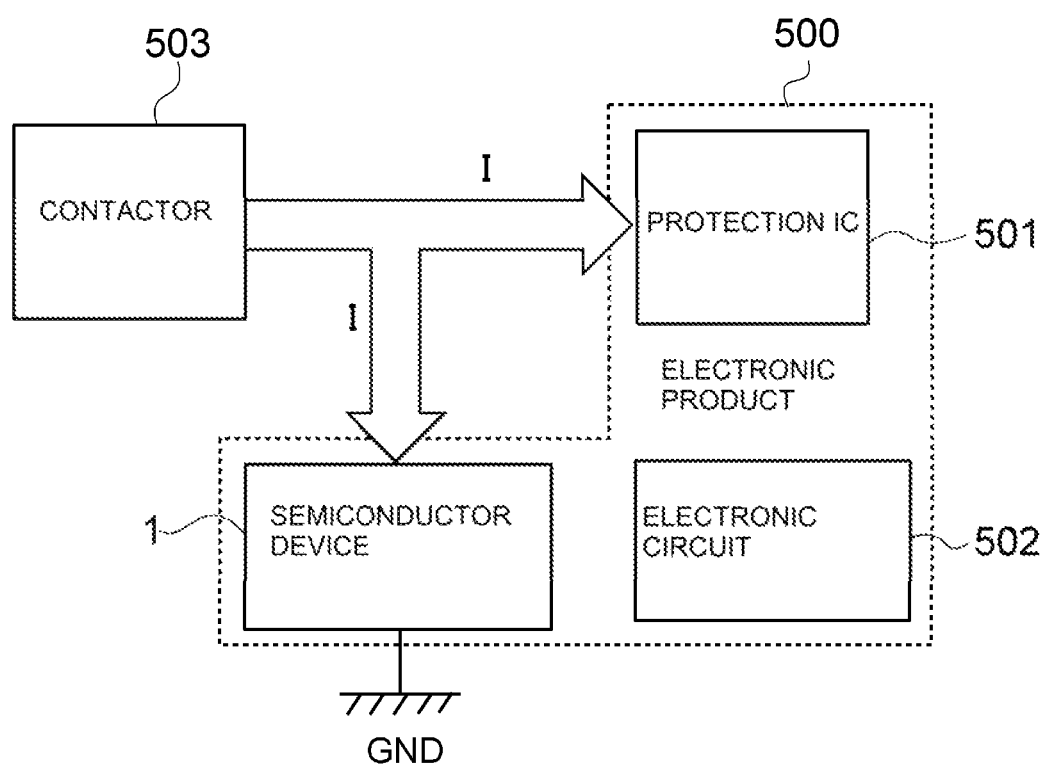
FIG. 3 is a block diagram which illustrates an example of a use of the semiconductor device according to the embodiment.

FIG. 3 is a block diagram which illustrates an example of a use of the semiconductor device according to the embodiment.

The semiconductor device 1 is incorporated in, for example, an electronic product 500. The electronic product 500 includes a protection circuit 501 in addition to an ESD protection diode (semiconductor device 1). The protection circuit 501 is connected to a contactor 503. The semiconductor device 1 is provided between the protection circuit 501 and the contactor 503. An electronic circuit 502 in the electronic product 500 is protected from an external transient current by the semiconductor device 1 and the protection circuit 501. The contactor 503 is, for example, an electronic part attached to the electronic product 500.

For example, it is assumed that a transient current I flows into the electronic product 500 from the contact 503. In this case, it is desirable that the transient current I be preferentially absorbed by the semiconductor device 1 rather than the protection circuit 501. Accordingly, it is difficult for the transient current I to flow in the protection circuit 501 provided in a rear of the semiconductor device 1, thereby preventing the protection circuit 501 from being damaged.

In order that the transient current I is preferentially absorbed in the semiconductor device 1, it is desirable that a dynamic resistance (Rdyn) of the semiconductor device 1, when the transient current I flows into the semiconductor device 1, be low. For example, when the dynamic resistance of the semiconductor device 1 is high, the transient current I is not absorbed in the semiconductor device 1, and the transient current I flows in the protection circuit 501, whereby the protection circuit 501 itself may be damaged.

Furthermore, in order to lower a voltage applied to the protection circuit 501 to electrically protect the protection circuit 501, it is desirable to lower an absolute value of a breakdown voltage VBR of the zener diode D3. Accordingly, the voltage (clamp voltage) applied to the protection circuit 501 becomes lower.

However, when the absolute value of the breakdown voltage VBR of the zener diode D3 is lowered, it is necessary to sufficiently suppress leakage current which occurs when reverse bias is applied to the zener diode D3. Accordingly, a snap-back phenomenon within the semiconductor device 1 is caused. Here, the snap back phenomenon refers to a phenomenon in which a current rise generally occurs in response to a voltage rise in a current-voltage curve, but when a voltage is increased to exceed a certain voltage, a current is increased despite a lowering of the voltage. In the semiconductor device 1, the snap-back phenomenon is caused, whereby low resistance of the dynamic resistance is realized.

Figure 4A:
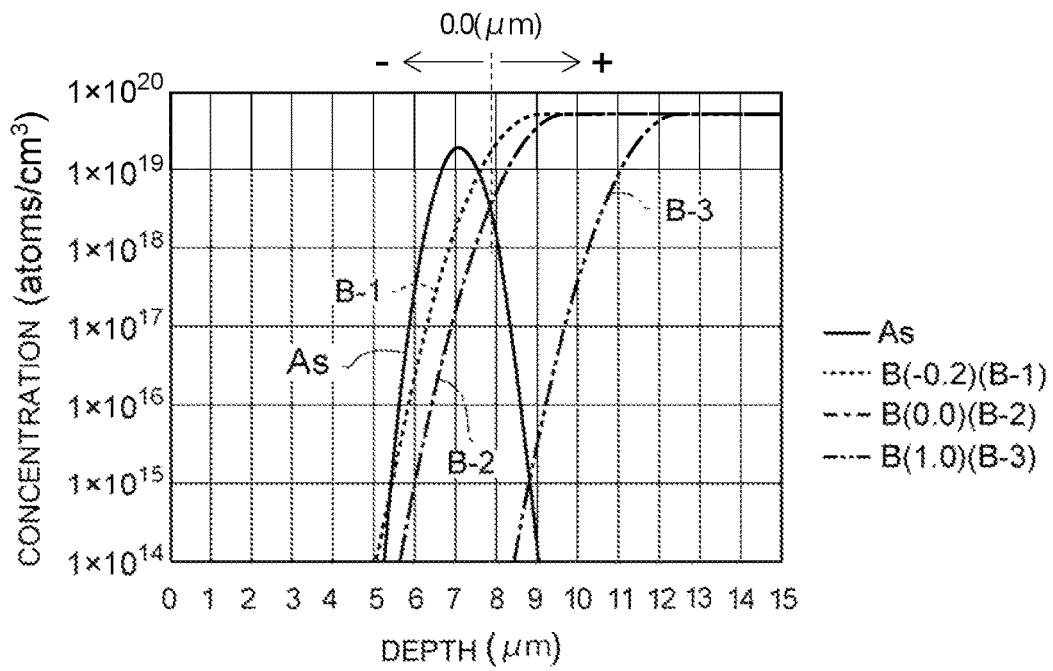
FIG. 4A is a graph which illustrates a change in an dopant concentration in the vicinity of a PN junction when an dopant concentration profile on a P-side of a zener diode D3 of the semiconductor device according to the embodiment is changed.
Figure 4B:
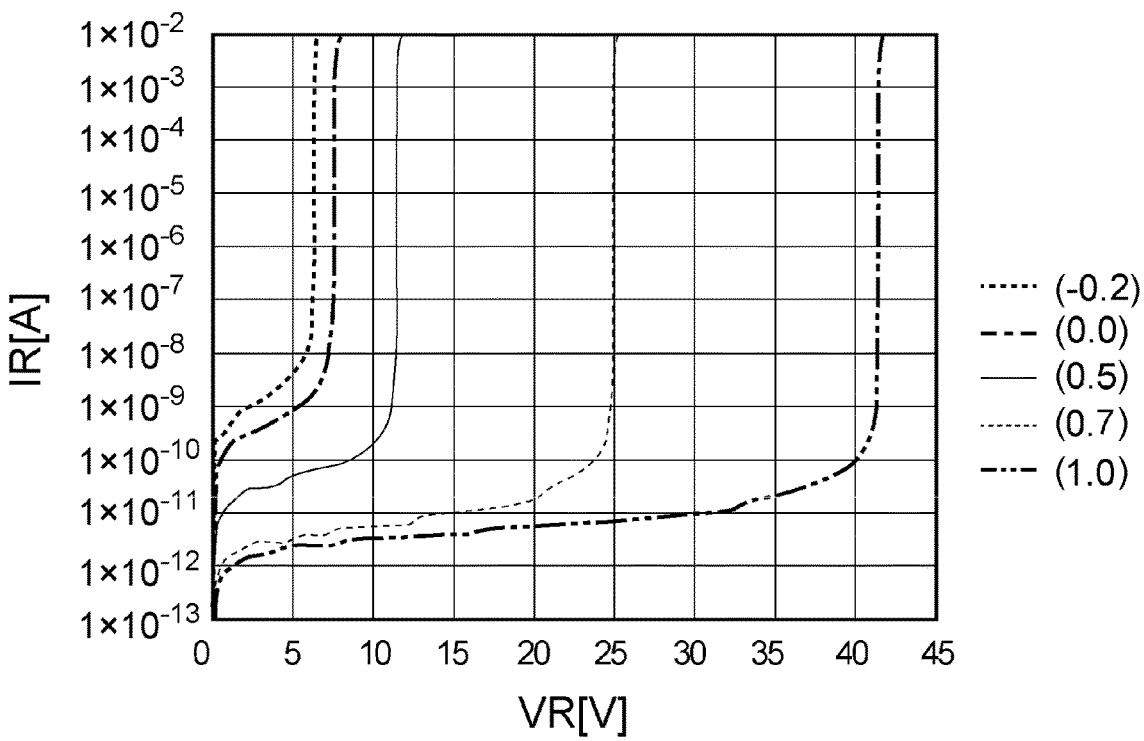
FIG. 4B is a graph which illustrates a current-voltage curve of a zener diode breakdown when the dopant concentration profile on the P side of the zener diode D3 of the semiconductor device according to the embodiment is changed.

FIG. 4A is a graph which illustrates a change in an dopant concentration in the vicinity of a PN junction when an dopant concentration profile on a P-side of the zener diode D3 of the semiconductor device according to the embodiment is changed, and FIG. 4B is a graph which illustrates a current-voltage curve of a zener diode breakdown when the dopant concentration profile on the P side of the zener diode D3 of the semiconductor device according to the embodiment is changed.

A horizontal axis of FIG. 4A indicates a depth (μm) of the semiconductor region 20 at which the dopant concentration is present, and a vertical axis indicates a dopant concentration (atoms/cm$^3$). In FIG. 4A, dopant concentration profiles of arsenic (As), and boron (B) are illustrated. Moreover, in the embodiment, a dopant concentration at a point at which a dopant concentration profile of arsenic (As) intersects with a dopant concentration profile of boron (B) is defined as "intersection concentration". With regard to boron (B), three examples in which the intersection concentration is changed are exemplified.

Here, when the X-axis location (depth of intersection) between curve B-2 of an dopant concentration profile of boron (B) and a curve As of the dopant concentration profile of arsenic (As) is set as the reference depth (0.0 μm), the location on the X axis (relative depth of intersection) of the intersection between a curve B-1 of an dopant concentration profile of boron (B) and the curve As of an dopant concentration profile of arsenic (As) deviates by −0.2 μm from the reference location (As concentration of about $1\times10^{19}$ atoms/cm$^2$). In addition, the x axis location (relative depth of intersection) of an intersection between a curve B-3 of a dopant concentration profile of boron (B) and the curve As of a dopant concentration profile of arsenic (As) in the X-axis deviates by +1.0 μm from the reference location (B concentration of about $1\times10^{15}$ atoms/cm$^2$). These deviation values are shown in parentheses after the reference line configuration for each B concentration is depicted. In addition, as these deviation values are shifted to a negative side, it means that the intersection concentration increases.

Here, an absolute value of a breakdown voltage (VBR) when the dopant concentration profile of boron (B) is that depicted in curve B-3 is about 9.1 V (current 1 mA), and an absolute value of a breakdown voltage (VBR) when the dopant concentration profile of boron (B) is the curve B-1 is about 7.2 V (current 1 mA). That is, it is known that the absolute value of a breakdown voltage (VBR) decreases as the intersection concentration increases. As an example of the factor, it is considered that extension of a depletion layer in the vicinity of the PN junction when a reverse bias is applied is suppressed as the intersection concentration increases.

Specifically, when a dopant concentration of the semiconductor region 20 or a dopant concentration of the semiconductor region 33 in a junction in which the semiconductor region 20 and the semiconductor region 33 are joined is $1\times10^{17}$ (atoms/cm$^3$) or more, it is known that an absolute value of a voltage VBR is about 7.2 to 7.6 V (at a current of 1 mA).

Moreover, in FIG. 4B, without changing the dopant concentration profile of arsenic (As), a current-voltage curve of a zener diode breakdown when the dopant concentration profile of boron (B) is changed is illustrated. Here, the smaller the number in parentheses, the higher the intersection concentration.

From the result, it is known that as the intersection concentration increases, the leakage current of the zener diode D3 becomes larger. It is considered that this is because a width of forbidden band becomes narrower as the intersection concentration increases. The leakage current of the zener diode D3 is a current flowing before a breakdown of the zener diode D3 when applying a reverse bias to the zener diode D3.

For example, the intercept between the curve B-3 of the dopant concentration profile of boron (B) and the curve As of the dopant concentration profile of arsenic (As) is shifted on the x-axis by +1.0 μm is about $9.4\times10^{-11}$ (A) (at a voltage of 3.3 V).

In contrast, an intersection between the curve B-1 of the dopant concentration profile of boron (B) and the curve As of the dopant concentration profile of arsenic (As) is positioned on the X-axis, a current value when a deviation from the reference is −0.2 μm is approximately $9\times10^{-10}$ (A) (at a voltage of 3.3 V), and the current value is increased.

Figure 5:
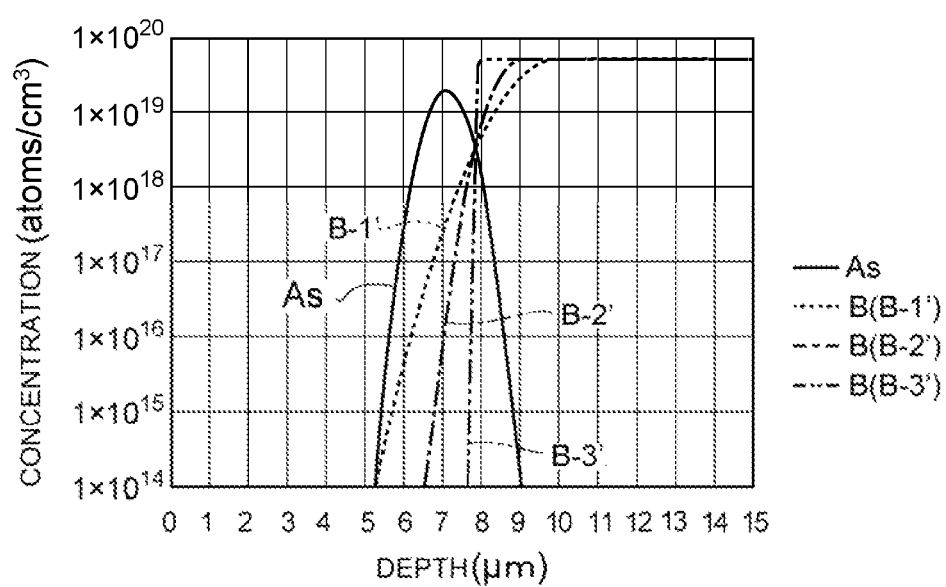
FIG. 5 is a graph which illustrates a dopant concentration in the vicinity of the PN junction when an inclination of the dopant concentration profile on the P-side of the zener diode D3 of the semiconductor device according to the embodiment is changed.

FIG. 5 is a graph which illustrates a dopant concentration in the vicinity of the PN junction when the slope of the dopant concentration profile on the P side of the zener diode D3 of the semiconductor device according to the embodiment is changed.

A horizontal axis of FIG. 5 is a distance (μm), and a vertical axis is a dopant concentration (atoms/cm$^3$).

In FIG. 5, an intersection concentration between each curve B-1', B-2', and B-3' of the dopant concentration profile of boron (B) and the curve As of the dopant concentration profile of arsenic (As) corresponds to approximately $5\times10^{18}$ (atoms/cm3). However, the slopes of the curves of the dopant concentration profile become steeper in an order of the curve B-1', the curve B-2', and the curve B-3'.

Here, the breakdown voltage VBR tends to be lower as the slope of the curve representing the dopant concentration versus depth profile becomes steeper. For example, an absolute value of the breakdown voltage (VBR) when the dopant concentration versus depth profile of boron (B) is represented by curve B-1' is about 7.7 V (current 1 mA), an absolute value of the breakdown voltage VBR when the dopant concentration versus depth profile of boron (B) is represented by curve B-2' is about 7.6 V (current 1 mA), and an absolute value of the breakdown voltage (VBR) when the of boron (B) is represented by curve B-3' is about 5.3 V (current 1 mA). It is believed that this is because the extension of the depletion layer in the vicinity of the PN junction when a reverse bias is applied is further suppressed as the dopant concentration profile of boron (B) becomes steeper.

Furthermore, it is known that the leakage current of the zener diode D3 is relatively decreased compared to when the intersection concentration of boron and arsenic is changed. For example, the current value is about $4.5\times10^{-10}$ (A) (at a voltage of 3.3 V) when the dopant concentration profile of boron (B) is the curve B-3', a current value is about $4.6\times10^{-10}$ (A) (at a voltage of 3.3 V) when the dopant concentration profile of boron (B) is the curve B-2', and a current value is about $3.6\times10^{-10}$ (A) (at a voltage of 3.3 V) when the dopant concentration profile of boron (B) is the curve B-1'

Figure 6A:
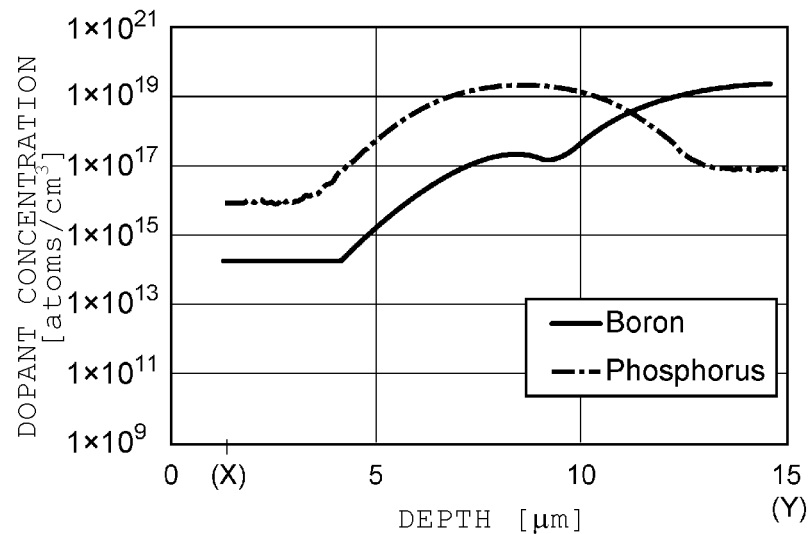
FIG. 6A is a dopant concentration profile in a depth direction of a semiconductor device according to a reference example, and is a graph which illustrates a dopant concentration taken along line X-Y of FIG. 6B.
Figure 6B:
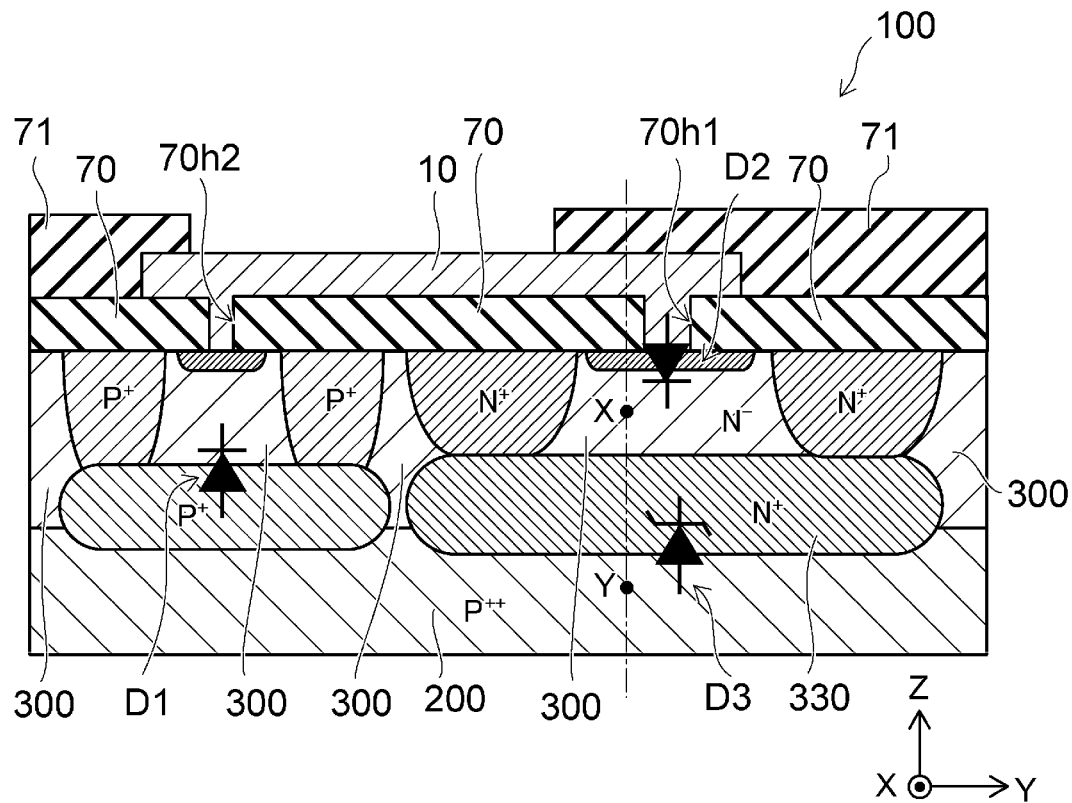
FIG. 6B is a schematic cross-sectional view which illustrates the semiconductor device according to the reference example.

FIG. 6A depicts the dopant concentration profile in a depth direction of a semiconductor device according to a reference example, and illustrates a dopant concentration taken along line X-Y of FIG. 6B. FIG. 6B is a schematic cross-sectional view which illustrates the semiconductor device according to the reference example. The dopant concentration profile is measured by, for example, SIMS.

In a semiconductor device 100 according to the reference example, a conductivity type of each semiconductor region is reversed to a conductivity type of the semiconductor device 1. That is, an N-type semiconductor region of the semiconductor device 1 becomes a P-type semiconductor region in the semiconductor device 100, and a P-type semiconductor region of the semiconductor device 1 becomes an N-type semiconductor region in the semiconductor device 100.

In the semiconductor device 100, a P$^{++}$-type semiconductor region 200 is used as a semiconductor substrate. An N$^-$-type semiconductor region 300 is formed on the semiconductor region 200 by the epitaxial growth. An N$^+$-type semiconductor region 330 is provided between the semiconductor region 200 and the semiconductor region 300. The semiconductor region 200 contains boron (B), and the semiconductor region 300 contains phosphorus (p).

Here, a diffusion coefficient of boron (B) in a silicon crystal is higher than a diffusion coefficient of arsenic (As) in the silicon crystal. Accordingly, boron (B) diffuses from the semiconductor region 200 into the semiconductor region 300 during the process of manufacturing the semiconductor device 100. As a result, in the semiconductor device 100, there is a possibility that the dopant concentration profile of boron (B) in the zener diode D3 becomes moderated, and leakage current of the zener diode D3 cannot be sufficiently suppressed.

Figure 7A:
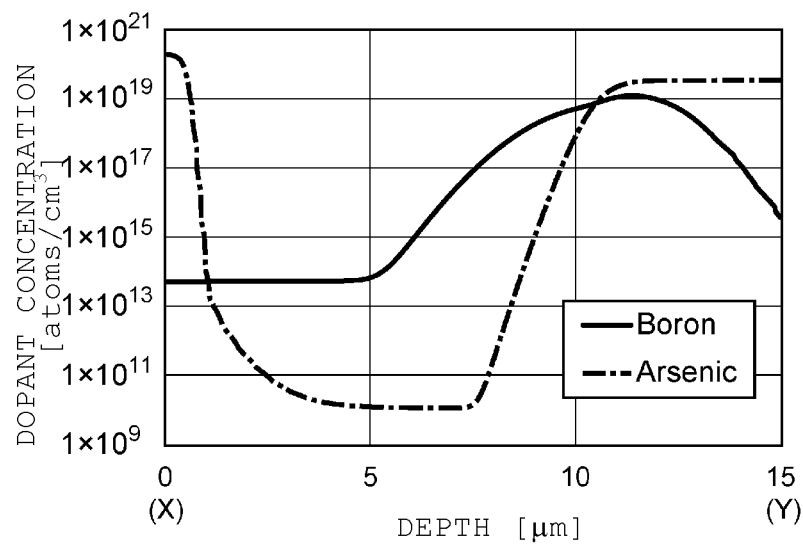
FIG. 7A is a dopant concentration profile in the depth direction of the semiconductor device according to the embodiment, and is a graph which illustrates a dopant concentration taken along line X-Y of FIG. 7B.
Figure 7B:
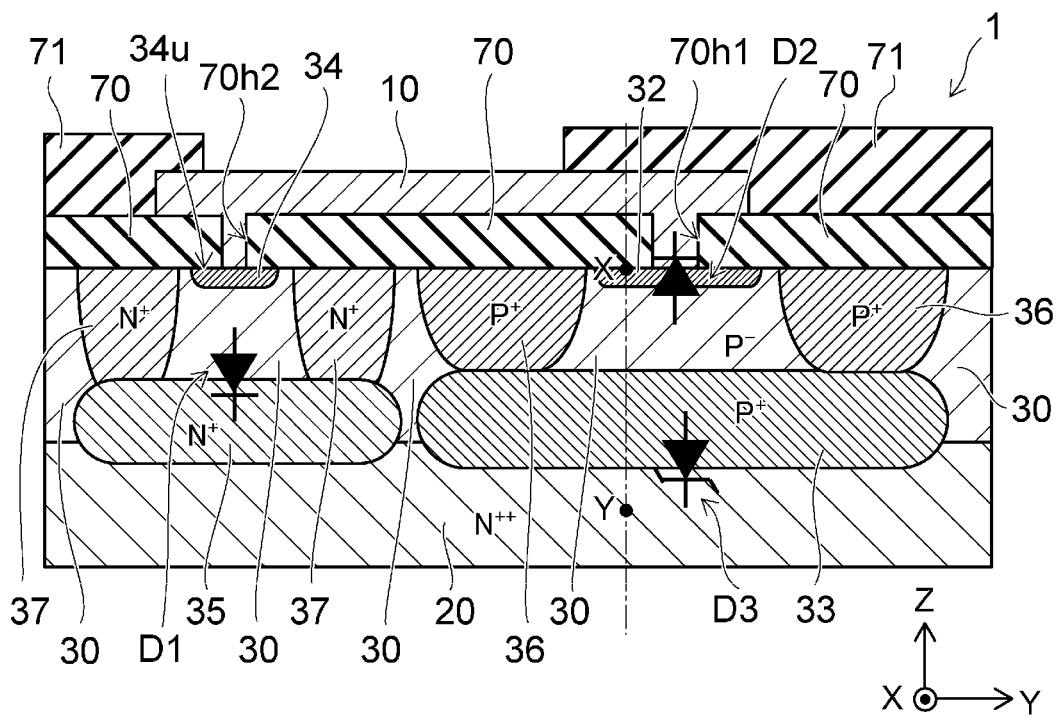
FIG. 7B is a schematic cross-sectional view which illustrates the semiconductor device according to the embodiment.

FIG. 7A illustrates the dopant concentration profile in the depth direction of the semiconductor device according to the embodiment, and is a graph which illustrates the dopant concentration taken along line X-Y of FIG. 7B. FIG. 7B is a schematic cross-sectional view which illustrates the semiconductor device according to the embodiment. The dopant concentration profile is measured by, for example, the SIMS.

In contrast to the reference semiconductor device 100, an $N^{++}$-type semiconductor region 20 is used as a semiconductor substrate in the semiconductor device 1 according to the embodiment. The semiconductor region 20 contains arsenic (As) as the n type dopant.

Accordingly, during a process of manufacturing the semiconductor device 1, arsenic (As) is unlikely to be diffused from the semiconductor region 20 to the semiconductor region 30, and the dopant concentration profile of boron (B) in the zener diode D3 becomes steeper than in the semiconductor device 100. Accordingly, it is possible to reduce a breakdown voltage and to suppress the leakage current of the zener diode D3 in the semiconductor device 1, compared to the leakage current in the semiconductor device 100

Furthermore, in the semiconductor device 1 according to the embodiment, a parasitic NPN transistor present in the semiconductor device 1 operates and a carrier in the semiconductor device 1 is increased, thereby further reducing the clamping voltage.

Figure 8A:
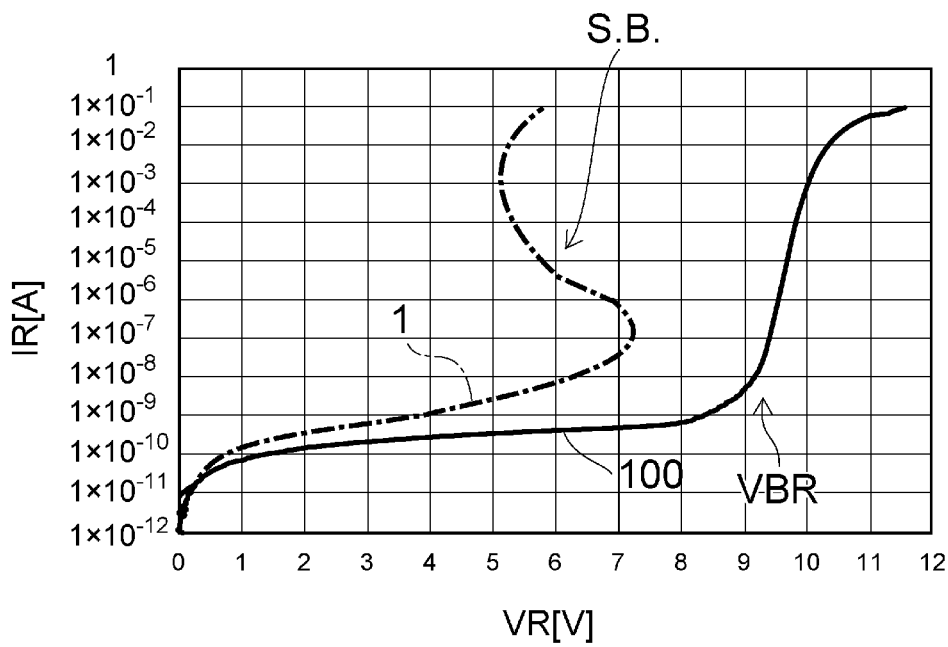
FIG. 8A is a graph which illustrates a current-voltage curve when a parasitic NPN transistor present in the semiconductor device operates or does not operate.
Figure 8B:
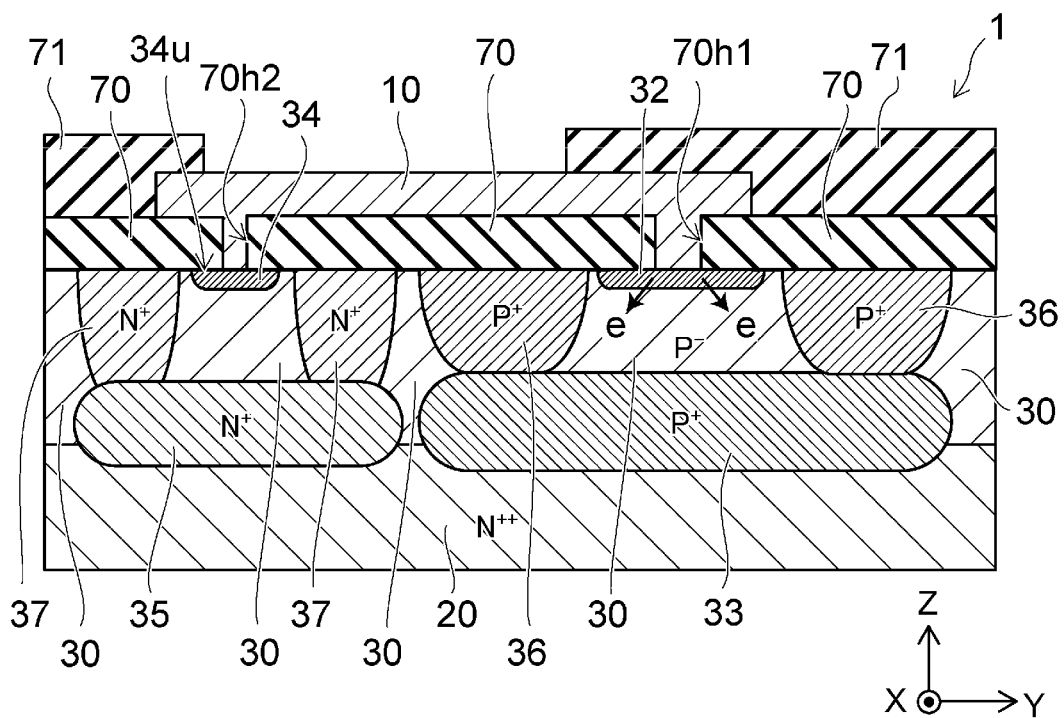
FIG. 8B is a schematic cross-sectional view which describes an example of a factor for which the parasitic NPN transistor present in the semiconductor device operates.

FIG. 8A is a graph which illustrates a current-voltage curve when a parasitic NPN transistor present in the semiconductor device operates or does not operate, and FIG. 8B is a schematic cross-sectional view which describes an example of a factor for which the parasitic NPN transistor present in the semiconductor device operates.

Here, the current-voltage curve illustrated in FIG. 8A is a current-voltage curve of the PN diode D2 and the zener diode D3 which are connected in series. The horizontal axis of FIG. 8A is a reverse bias voltage. Moreover, in addition to the semiconductor device 1, a current-voltage curve of the semiconductor device 100 according to the reference example is illustrated in FIG. 8A as curve S.B.

In the semiconductor device 1, an NPN transistor is configured to have not only the PN diode D2 and the zener diode D3, but also the $N^+$-type semiconductor region 32 (emitter)/the $P^-$-type semiconductor region 30, and the $P^+$-type semiconductor region 33 (base)/the $N^{++}$-type semiconductor region 20 (collector).

When a voltage is applied between the $N^+$-type semiconductor region 32, and the $P^-$-type semiconductor region 30 and the $P^+$-type semiconductor region 33, whereby an electron (e) is injected in the $P^-$-type semiconductor region 30 and the $P^+$-type semiconductor region 33 from the $N^+$-type semiconductor region 32, a base current flows to turn on the NPN transistor before a breakdown of the zener diode D3 in some cases. That is, in the semiconductor device 1, as illustrated in FIG. 8A, when a voltage (VR) is increased, a snap-back in which the voltage (VR) is first lowered and a current is increased occurs before the breakdown of the zener diode D3. As a result, a substantial breakdown voltage is lowered in the semiconductor device 1.

In contrast, the parasitic NPN transistor is not embedded in the semiconductor device 100 according to the reference example. Accordingly, a snap-back of the NPN transistor does not occur, but a breakdown voltage (curve VBR) of the semiconductor device 100 becomes higher than a breakdown voltage of the semiconductor device 1.

Figure 9A:
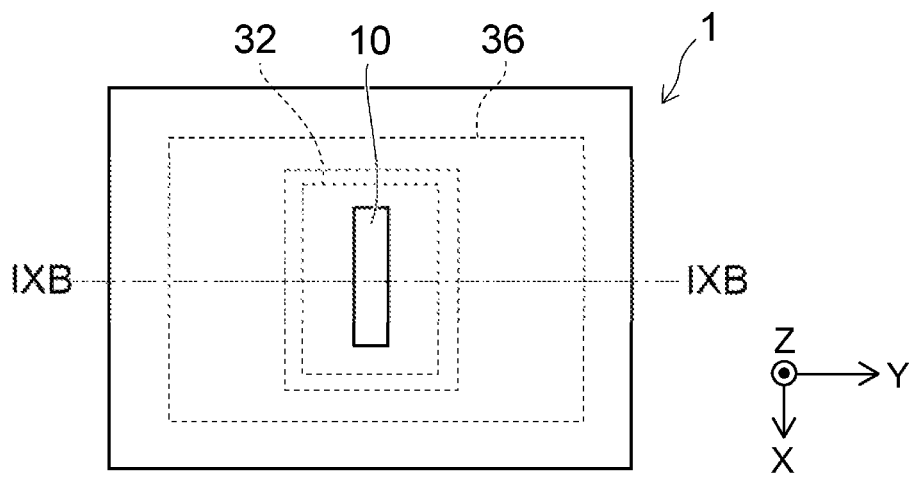
FIG. 9A is a schematic plan view which illustrates a PN diode D2 and the zener diode D3 of the semiconductor device according to the embodiment, and is a view which illustrates a section taken along line IXA-IXA of FIG. 9B.
Figure 9B:
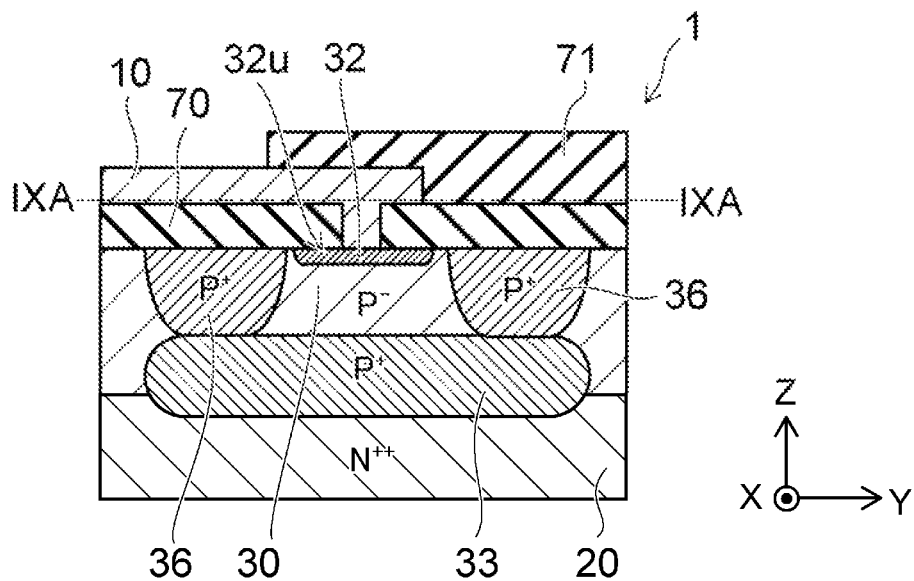
FIG. 9B is a schematic cross-sectional view which illustrates the PN diode D2 and the zener diode D3 of the semiconductor device according to the embodiment, and is a view which illustrates a section taken along line IXB-IXB of FIG. 9A.
Figure 9C:
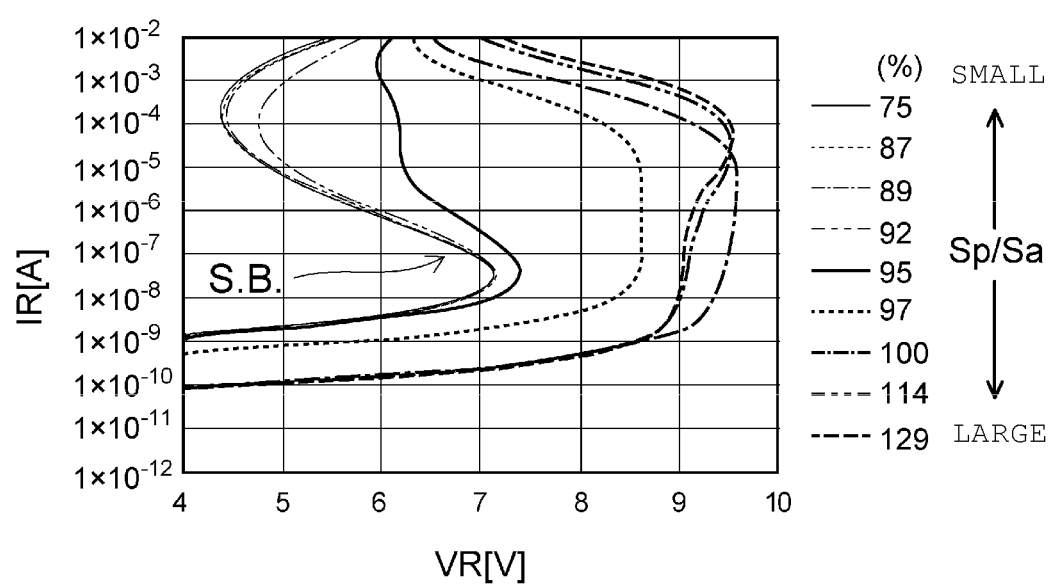
FIG. 9C is a graph which illustrates a current-voltage curve of the PN diode D2 and the zener diode D3 of the semiconductor device according to the embodiment.

FIG. 9A is a schematic plan view which illustrates the PN diode D2 and the zener diode D3 of the semiconductor device according to the embodiment, and is a view which illustrates a section taken along line IXA-IXA of FIG. 9B. FIG. 9B is a schematic cross-sectional view which illustrates the PN diode D2 and the zener diode D3 of the semiconductor device according to the embodiment, and is a view which illustrates a section taken along line IXB-IXB of FIG. 9A. FIG. 9C is a graph which illustrates a current-voltage curve of the PN diode D2 and the zener diode D3 of the semiconductor device according to the embodiment.

The current-voltage curve illustrated in FIG. 9C is a current-voltage curve of the PN diode D2 and the zener diode D3 connected in series. A horizontal axis of FIG. 9C indicates a voltage on a reverse bias side. FIG. 9C illustrates a change in snap-back when a ratio of an opening area Sp to an area Sa of the top surface $34u$ of the semiconductor region 32 is changed.

As illustrated in FIG. 9C, as the opening area Sp of the opening through the insulating layer 70 through which the wiring layer 10 extends into contact with the semiconductor region 32 becomes smaller in comparison with the area of the top surface $32u$ of the semiconductor region 32, snap-back is more likely to occur. Accordingly, when an area of the top surface $32u$ of the semiconductor region 32 is Sa, and an area of a portion of the top surface $32u$ opened by the opening $70h1$ (FIG. 1B) is Sp, a ratio of Sp to Sa is adjusted to a range from 10% to 90%.

When the ratio of Sp to Sa is less than 10%, an opening of the N+-type semiconductor region 32 becomes too small, and the contact resistance between the $N^+$-type semiconductor region 32 and the wiring layer 10 is unacceptably increased.

In addition, when the ratio of Sp to Sa is larger than 90%, a voltage drop is unlikely to occur between the wiring layer 10 side and the $p^-$-type semiconductor region 30 side in the $N^+$-type semiconductor region 32. That is, a potential gradient (electric field) hardly occurs in the $N^+$-type semiconductor region 32.

Accordingly, the electrons injected in the $P^-$-type semiconductor region 30 and the $P^+$-type semiconductor region 33 from the $N^+$-type semiconductor region 32 are insufficient, a base current in the $P^-$-type semiconductor region 30 and the $P^+$-type semiconductor region 33 is unlikely to increase. That is, the NPN transistor is unlikely to be turned on.

In this case, breakdown current becomes a base current to cause a snap-back after a breakdown of the zener diode D3. However, in this case, the clamping voltage is determined by a sole breakdown voltage of the zener diode D3, and the clamping voltage is not lowered in some cases.

As described above, in the embodiment, snap-back occurs by using the parasitic NPN transistor of the semiconductor device 1 to lower a breakdown voltage of the zener diode D3 and to suppress a leakage current of the zener diode D3. Accordingly, it is possible to reduce a clamping voltage of a protection circuit connected to the semiconductor device 1, thereby reliably ensuring ESD protection.

In the embodiment described above, "on" in an expression that "a portion A is provided on a portion B" is used to mean a case where the portion A does not come into contact with the portion B and the portion A is provided above the portion B in addition to a case where the portion A comes into contact with the portion B and the portion A is provided on the portion B. Furthermore, "the portion A is provided on the portion B" may be applied to a case where the portion A and the portion B are reversed and the portion A is positioned below the portion B, or a case where the portion A and the portion B are horizontally provided in the same line with each other. This is because the structure of the semiconductor device is not changed between before and after the rotation even if the semiconductor device according to the embodiment is rotated.

Hitherto, the embodiments are described with reference to the specific examples. However, the embodiments are not limited to the specific examples. That is, one in which those skilled in the art apply appropriate design changes to those specific examples is included in the range of the embodiments as long as it includes the characteristics of the embodiments. Each element included in the specific examples and, a disposition, a material, a condition, a shape, a size thereof, and the like are not limited to those which are illustrated above and can be appropriately changed.

Furthermore, each of the elements included in each embodiment can be combined as long as it is technically possible and the combination is included in the range of the embodiments as long as each of the elements includes the characteristics of the embodiments. In addition, in a category of the spirit of the embodiments, those skilled in the art can derive various modified examples and corrected examples, and the modified examples and the corrected examples are understood to be also included in the range of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of providing electrostatic discharge protection to a semiconductor device, comprising:
   providing a first semiconductor region of a first conductivity type;
   forming a Zener diode on a first portion of the first semiconductor region;
   forming a first PN diode on the Zener diode, the first PN diode comprising a portion of a second semiconductor region of a second conductivity type overlying the first semiconductor region, and a fourth semiconductor region of the first conductivity type overlying the second semiconductor region;
   forming a second PN diode on a second portion of the first semiconductor region adjacent to the first portion, the second PN diode having a cathode side in electrical contact with the first semiconductor region;
   forming an insulating layer over the first and second PN diodes;
   forming a first opening extending through the insulating layer to expose a portion of a surface of the fourth semiconductor region; and
   forming a second opening extending through the insulating layer to contact the second diode, wherein the ratio of the area of the surface of the fourth semiconductor region exposed by first opening to the total area of the surface of the fourth semiconductor region is greater than or equal to ten percent and less than or equal to ninety percent.

2. The method of claim 1, further comprising:
   providing a conductor over the insulating layer that is in electrical contact with the fourth semiconductor region and the second PN diode.

3. An electrostatic discharge protection device, comprising:
   a first semiconductor region of a first conductivity type;
   a first PN diode disposed on and having a cathode side in electrical contact with the first semiconductor region;
   a Zener diode comprising the first semiconductor region and a second semiconductor region of a second conductivity type, the second semiconductor region being selectively disposed on the first semiconductor region;
   a second PN diode comprising a third semiconductor region of the second conductivity type and a fourth semiconductor region of the first conductivity type, the third semiconductor being between the fourth semiconductor region and the second semiconductor region; and
   an insulating layer overlying the first PN diode, the second PN diode, and the Zener diode, the insulating layer having a first opening therethrough extending to a surface of the fourth semiconductor region and a second opening therein extending to the first PN diode, wherein the ratio of the area of the surface of the fourth semiconductor region exposed by the first opening to the total area of the surface of the fourth semiconductor region is greater than or equal to ten percent and less than or equal to ninety percent.

4. The electrostatic discharge protection device of claim 3, further comprising:
   a conductor layer overlying the insulating layer and electrically contacting the fourth semiconductor region and the first PN diode.

5. The electrostatic discharge protection device of claim 3, wherein the first PN diode comprises:
   a portion of the third semiconductor region;
   a fifth semiconductor region of the first conductivity type between the first and third semiconductor regions; and
   a sixth semiconductor region of the first conductivity type between the third semiconductor region and the second opening.

6. The electrostatic discharge protection device of claim 3, wherein the first semiconductor region is n doped.

7. The electrostatic discharge protection device of claim 3, wherein the first PN diode is electrically connected in parallel to the second PN diode and the Zener diode.

8. The electrostatic discharge protection device of claim 7, wherein the second PN diode is electrically connected in series with the Zener diode.

9. The electrostatic discharge protection device of claim 3, wherein the first semiconductor region is a semiconductor substrate.

10. The electrostatic discharge protection device of claim 9, wherein the semiconductor substrate is n doped.

* * * * *